(12) United States Patent
Jiang et al.

(10) Patent No.: US 7,205,475 B2
(45) Date of Patent: Apr. 17, 2007

(54) COVER ASSEMBLY

(75) Inventors: Xiao-Gang Jiang, Shenzhen (CN); Hung-Chun Lu, Tu-Cheng (TW); Wen-Kang Lo, Tu-Cheng (TW); Chien-Li Tsai, Tu-Cheng (TW); Jiang Zhao, Shenzhen (CN)

(73) Assignees: Hong Fu Jin Precision Industry (Shenzhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/440,317

(22) Filed: May 24, 2006

(65) Prior Publication Data

US 2006/0272839 A1 Dec. 7, 2006

(30) Foreign Application Priority Data

Jun. 4, 2005 (CN) .................. 2005 2 0059629

(51) Int. Cl.
*H02G 3/08* (2006.01)

(52) U.S. Cl. .................. 174/50; 174/57; 174/66; 174/67; 220/3.2; 220/241; 220/242; 361/683

(58) Field of Classification Search ............... 174/50, 174/17 R, 66, 67, 135; 220/3.2, 241, 242; 381/87, 333, 334, 388, 349; 312/223.2, 223.3, 312/223.6; 361/683
See application file for complete search history.

(56) References Cited

U.S. PATENT DOCUMENTS

| | | | | | |
|---|---|---|---|---|---|
| 4,988,831 | A | * | 1/1991 | Wilson et al. | 174/135 |
| 5,294,013 | A | * | 3/1994 | Sasaki | 220/241 |
| 5,331,506 | A | * | 7/1994 | Nakajima | 361/683 |
| 5,924,782 | A | * | 7/1999 | Park | 220/242 |
| 5,955,700 | A | * | 9/1999 | Slipy et al. | 174/50 |
| 6,219,230 | B1 | * | 4/2001 | Cho | 361/683 |
| 6,595,605 | B1 | * | 7/2003 | Babcock et al. | 312/223.2 |
| 6,785,128 | B1 | * | 8/2004 | Yun | 361/683 |
| 7,002,073 | B2 | * | 2/2006 | Lai et al. | 174/50 |
| 7,027,297 | B1 | * | 4/2006 | Mizuno et al. | 361/683 |
| 2004/0240689 | A1 | | 12/2004 | Miyamoto | |

* cited by examiner

*Primary Examiner*—Angel R. Estrada
(74) *Attorney, Agent, or Firm*—Morris Manning & Martin LLP; Tim Tingkang Xia, Esq.

(57) ABSTRACT

A cover assembly for covering a hinge (31) of a portable device includes a base (10) and a cover (20). The base (10) includes a fixing portion (11) protruding therefrom, a pair of slide protrusions (114) is formed on the fixing portion (11), and a latching slot (19) is defined in the base (10) adjacent the fixing portion (11). The cover (20) includes a pair of sliding slots (211) corresponding to the slide protrusions (114), and a hook (231) is formed on the cover (20) for engaging the latching slot (19).

14 Claims, 6 Drawing Sheets

COVER ASSEMBLY

BACKGROUND OF THE INVENTION

1. Field of the Invention

The present invention relates to a cover assembly, and particularly to a cover assembly for a portable device.

2. General Background

Typically, a portable computer includes a base and a lid pivotally connected to the base through a hinge, and a fixing portion is formed on the base to receive and fix the hinge. However, exposure of the fixing portion or the hinge will affect aesthetics of the whole exterior of the portable computer.

What is desired, therefore, is a detachable cover which is firmly mounted on the base and covers the hinge.

SUMMARY

In one preferred embodiment, a cover assembly for covering a hinge of a portable device includes a base and a cover. The base includes a fixing portion protruding therefrom, a pair of slide protrusions is formed on the fixing portion, and a latching slot is defined in the base adjacent the fixing portion. The cover includes a pair of sliding slots corresponding to the slide protrusions, and a hook is formed on the cover for engaging the latching slot.

Other advantages and novel features will become more apparent from the following detailed description of a preferred embodiment when taken in conjunction with the accompanying drawings, in which:

DETAILED DESCRIPTION OF THE EMBODIMENT

Figure 1:
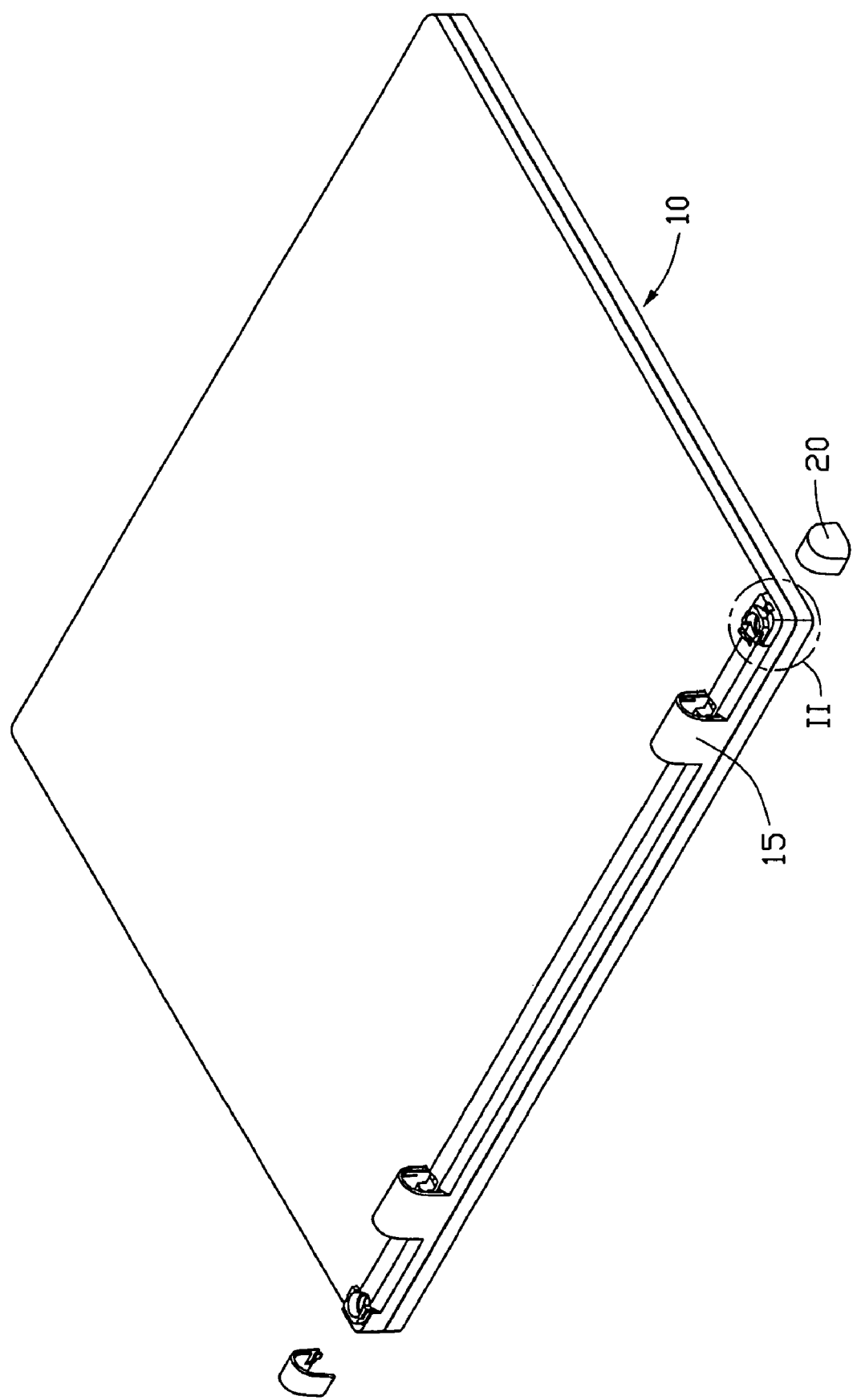
FIG. 1 is an exploded, isometric view of a cover assembly in accordance with a preferred embodiment of the present invention, the cover assembly includes a base and a pair of covers.

Referring to FIG. 1, a cover assembly is provided in accordance with the preferred embodiment of the present invention includes a base 10 and a pair of U-shaped covers 20. In this embodiment, the base 10 is a base portion of a portable electronic device like a portable computer.

Figure 2:
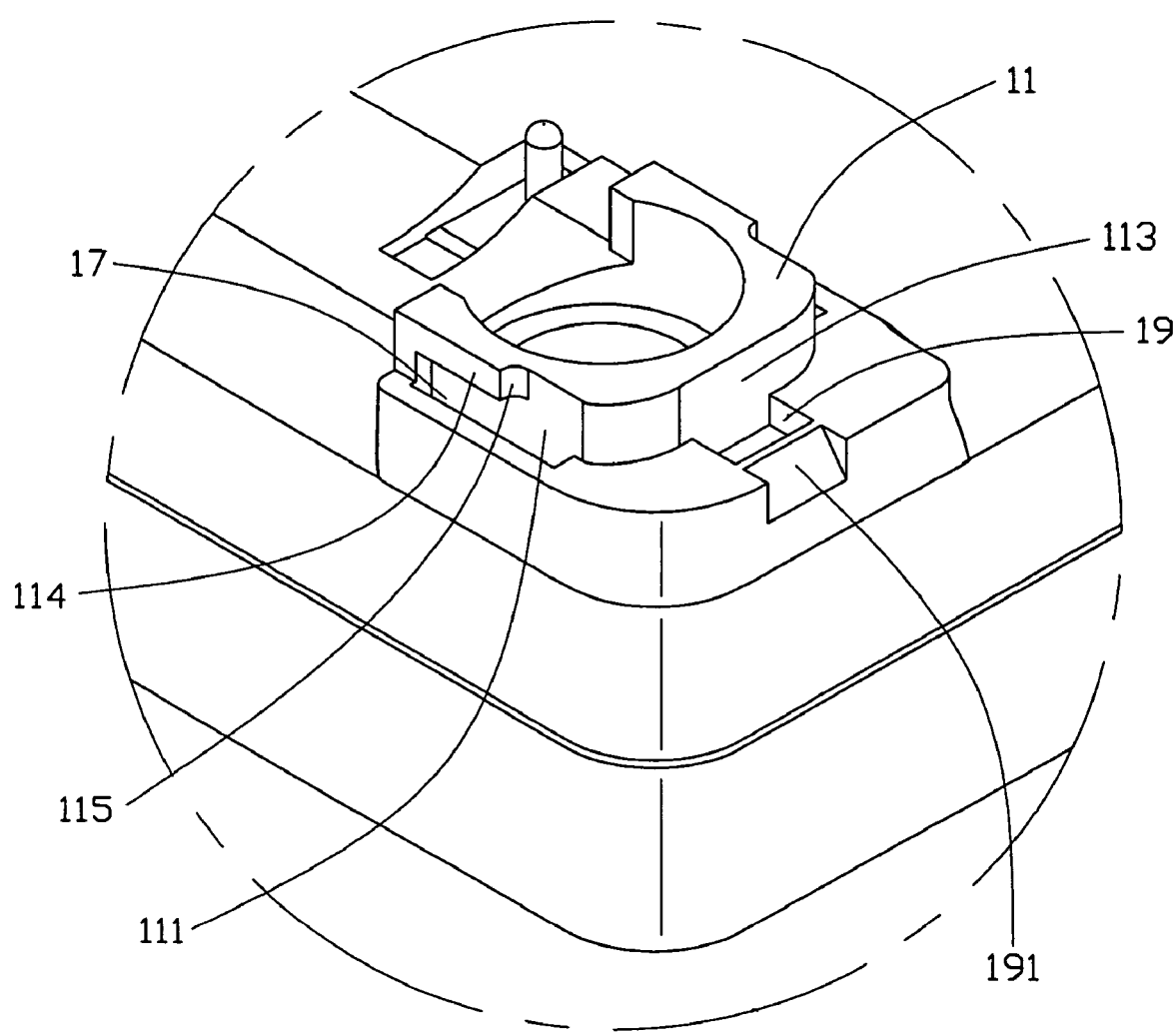
FIG. 2 is an enlarged isometric view of circled portion II of FIG. 1.

Referring also to FIG. 2, a pair of fixing portions 11 protrudes upwardly adjacent two sides of a rear edge of the base 10. A pair of retaining portions 15 is spaced formed between the fixing portions 11, and a fixing mechanism can be installed in each of the fixing portions 11 and retaining portions 15, for supporting and mounting a pair of interconnection parts like hinges 31 of a lid 30 (referring to FIG. 7).

Each of the fixing portions 11 includes two opposite first sidewalls 111 and a first end wall 113. A slide protrusion 114 protrudes from a top of each of the first sidewalls 111, and an embowed guiding face 115 is formed from an end of each of the slide protrusions 114. The base 10 defines a receiving recess 17 under each of the slide protrusions 114, and each of the recesses 17 longer than the corresponding slide protrusion 114 extends toward the first end wall 113. A latching slot 19 is defined in the base 10 adjacent the first end wall 113 of each of the fixing portions 11. An incline 191 is formed on the base 10 adjacent each of the latching slots 19 and opposite the corresponding first end wall 113.

Figure 3:
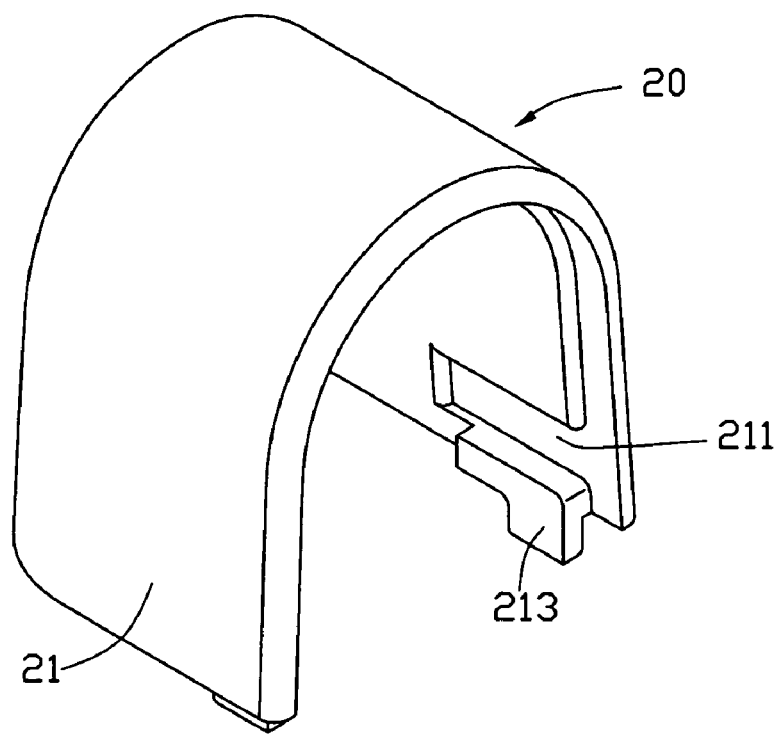
FIG. 3 is an enlarged isometric view of the cover of FIG. 1.
Figure 4:
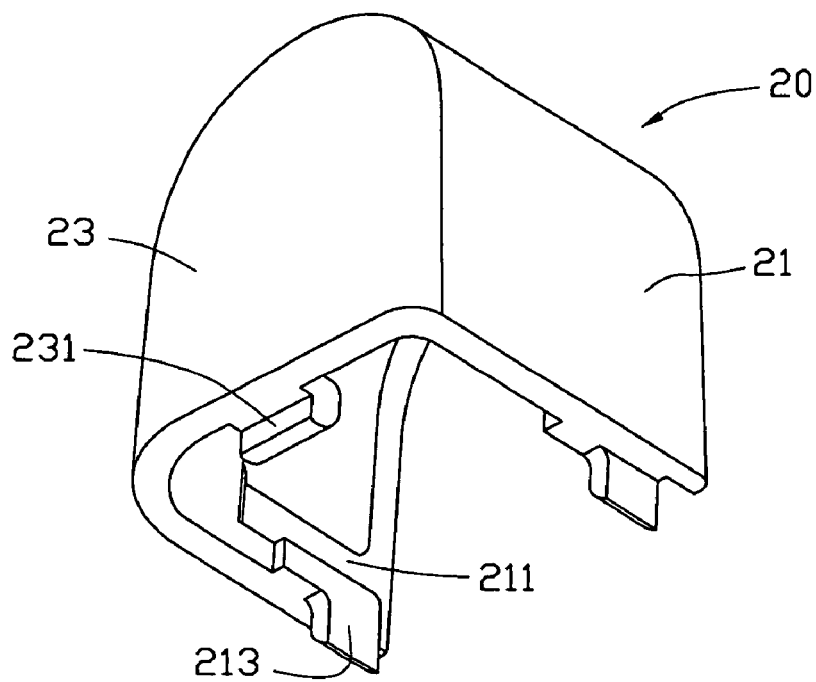
FIG. 4 is similar to FIG. 3, but viewed in another aspect.

Referring to FIGS. 3 and 4, the covers 20 are made of plastic material. Each of the covers 20 includes a pair of second sidewalls 21 and a second end wall 23. In an inner side of each of the second sidewalls 21 defines a sliding slot 211 corresponding to the slide protrusion 114 of the fixing portion 11. A block 213 protrudes downwardly from each of the second sidewalls 21 at an end far from the second end wall 23, corresponding to the receiving recesses 17 of the base 10. A hook 231 extends downwardly from the second end wall 23 of each of the covers 20 corresponding to the latching slots 19 of the base 10.

Figure 5:
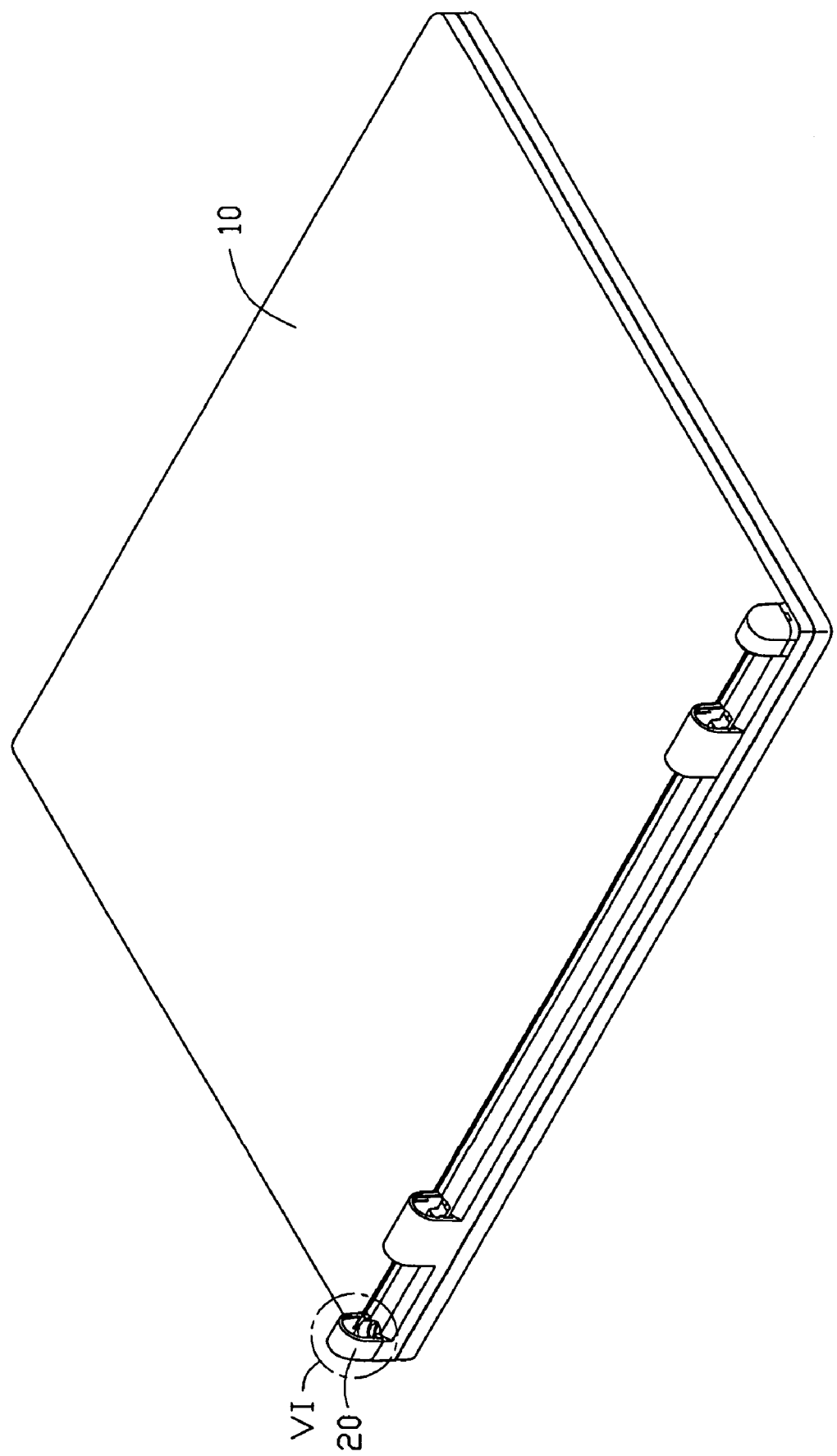
FIG. 5 is an assembled view of FIG. 1.
Figure 6:
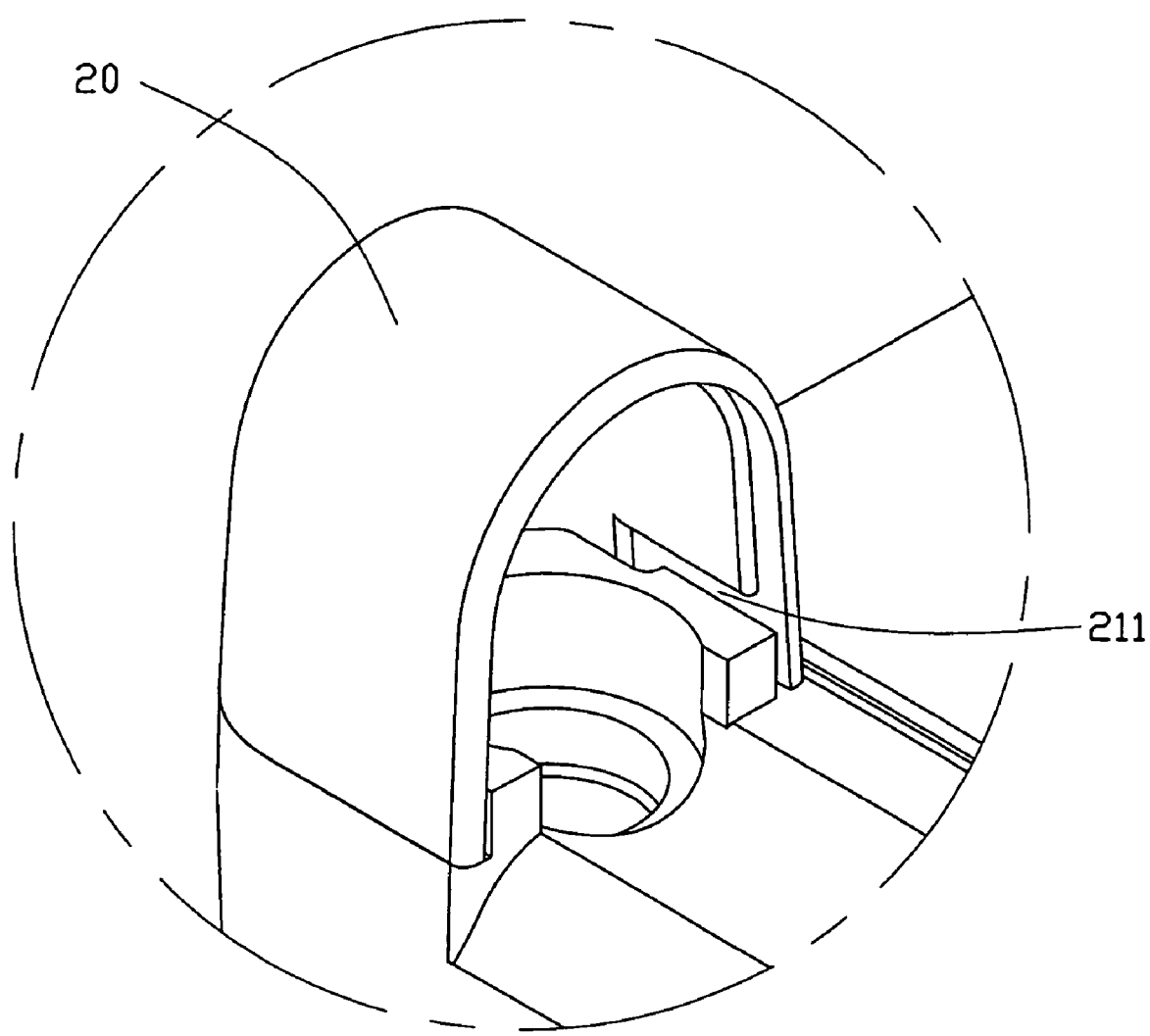
FIG. 6 is an enlarged isometric view of circled portion VI of FIG. 5.
Figure 7:
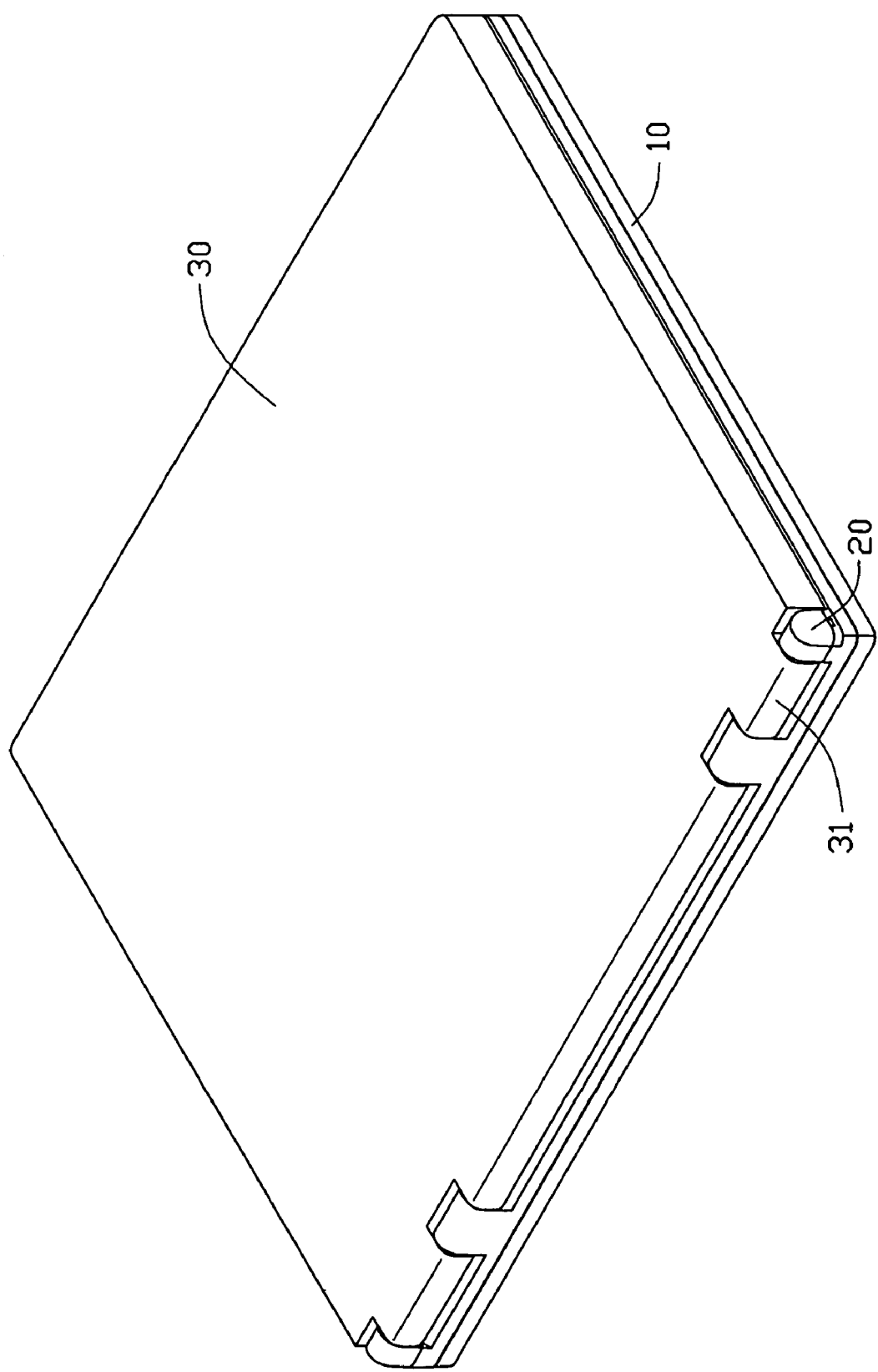
FIG. 7 is an assembled view showing a portable computer consisting of the cover assembly in accordance with a preferred embodiment of the present invention and a lid.

Referring to FIGS. 5 to 7, in assembly, the blocks 213 of each of the covers 20 abut against the guiding faces 115 of the slide protrusions 114 of the corresponding fixing portion 11. Pressing the covers 20 downwardly, the blocks 213 of each of the covers 20 enter into the corresponding receiving recesses 17 and engage the corresponding first sidewalls 111 respectively, and the hook 231 of each of the covers 20 abuts against the corresponding incline 191. Pushing the covers 20 toward the hinges 31 of the lid 30, the sliding slots 211 of each of the covers 20 receive the slide protrusions 114 of corresponding fixing portion 11, and slide along the slide protrusions 114. The hook 231 of each of the covers 20 gets over the corresponding incline 191 and engages in the corresponding latching slot 19 of the base 10, thereby the covers 20 are firmly mounted on the base 10.

To detach the covers 20 from the base 10, the covers 20 are pulled upwardly and are pushed away from the hinges 31 of the lid 30, with the hook 231 of each of the covers 20 disengaged from the corresponding latching slot 19 of the base 10. Pushing the covers 20 further until the sliding slots 211 exit from the slide protrusions 114 of the fixing portions 11, the covers 20 can be removed.

It is believed that the present embodiment and its advantages will be understood from the foregoing description, and it will be apparent that various changes may be made thereto without departing from the spirit and scope of the invention or sacrificing all of its material advantages, the example hereinbefore described merely being preferred or exemplary embodiment.

What is claimed is:

1. A cover assembly for covering a hinge of a portable device, comprising:
   a base comprising a fixing portion protruding therefrom, a pair of slide protrusions formed on the fixing portion, and a latching slot defined in the base adjacent the fixing portion; and
   a cover comprising a pair of sliding slots corresponding to the slide protrusions, and a hook formed on the cover for engaging the latching slot, wherein a receiving recess is defined in the base under each of the slide protrusions, and a pair of blocks protrudes from the cover for engaging in the receiving recesses.

2. The cover assembly as claimed in claim 1, wherein each of the receiving recesses is longer than the corresponding slide protrusion.

3. The cover assembly as claimed in claim 1, wherein the fixing portion comprises two opposite first sidewalls, the slide protrusions extend from the first sidewalls respectively, the cover comprises two opposite second sidewalls corresponding to the first sidewalls, and the sliding slots are defined in the inner side of the second sidewalls respectively.

4. The cover assembly as claimed in claim 3, wherein the fixing portion further comprises a first end wall adjacent the latching slot of the base, the cover comprises a second end wall corresponding to the first end wall, and the hook extends from the second end wall.

5. The cover assembly as claimed in claim 1, wherein an incline is formed on the base adjacent the latching slot.

6. The cover assembly as claimed in claim 1, wherein the base is a base portion of a portable computer, and the fixing portion is formed adjacent a side of a rear edge of the base portion.

7. A cover assembly for covering an exposure of a portable device, comprising:
a base comprising a fixing portion with two opposite first sidewalls and a first end wall; and
a cover mounted on the base, the cover comprising two opposite second sidewalls and a second end wall respectively corresponding to the first sidewalls and the first end wall of the fixing portion, a slide protrusion formed on one of the cover and the fixing portion, a sliding slot defined in the other one of the cover and the fixing portion, wherein the slide protrusions are formed on the fixing portion, the slide slots are defined in the cover for receiving the slide protrusions, two receiving recesses are defined in the base under the slide protrusions respectively, and two blocks protruding from the cover for engaging in the corresponding receiving recesses.

8. The cover assembly as claimed in claim 7, wherein the slide protrusions extend from the first sidewalls respectively, and the sliding slots are defined in the inner side of the second sidewalls respectively.

9. The cover assembly as claimed in claim 7, wherein a latching slot is defined in the base adjacent the fixing portion, and a hook is formed on the cover for engaging the latching slot.

10. The cover assembly as claimed in claim 9, wherein the latching slot is defined adjacent the first end wall, and the hook extends from the second end wall.

11. The cover assembly as claimed in claim 10, wherein an incline is formed on the base adjacent the latching slot.

12. The cover assembly as claimed in claim 7, wherein the base is a base portion of a portable computer, the fixing portion is formed adjacent a side of a rear edge of the base portion.

13. An electronic device comprising:
a base of said electronic device;
a lid of said electronic device removably attachable to said base and movable relative to said base between a first position thereof to cover a side of said base and a second position thereof to expose said side of said base;
an interconnection part connectably installable between said base and said lid in order to supportively control movement of said lid relative to said base between said first and second positions thereof; and
a cover removably installable to a selective one of said base and said lid for partially covering said interconnection part, said cover movable along a first direction and subsequently a second direction different from said first direction in order to retainably install to said selective one of said base and said lid, wherein said base comprises a fixing portion extending thereon in order to retainably install said cover, said fixing portion comprises a recess to allow movement of said cover along said first direction, and a protrusion to guide movement of said cover along said second direction.

14. The electronic device as claimed in claim 13, wherein said first direction which said cover moves along is perpendicular to said side of said base, and said second direction which said cover moves along subsequently is parallel to said side of said base.

* * * * *